United States Patent
Kim (10) Patent No.: US 7,889,592 B2
(45) Date of Patent: Feb. 15, 2011

(54) NON-VOLATILE MEMORY DEVICE AND A METHOD OF PROGRAMMING THE SAME

(75) Inventor: Moo-Sung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 219 days.

(21) Appl. No.: 12/219,359

(22) Filed: Jul. 21, 2008

(65) Prior Publication Data

US 2009/0031075 A1    Jan. 29, 2009

(30) Foreign Application Priority Data

Jul. 23, 2007    (KR) ...................... 10-2007-0073614

(51) Int. Cl.
*G11C 8/00* (2006.01)
(52) U.S. Cl. ........................... 365/230.08; 365/189.04; 365/189.05; 365/233.1

(58) Field of Classification Search ............ 365/233.08, 365/189.04, 189.05, 233.1
See application file for complete search history.

(56) References Cited

U.S. PATENT DOCUMENTS

| | | | | |
|---|---|---|---|---|
| 7,551,487 B2 * | 6/2009 | Park et al. | ............... | 365/185.22 |
| 2003/0043628 A1 * | 3/2003 | Lee | ........................ | 365/185.17 |
| 2008/0002468 A1 * | 1/2008 | Hemink | ................. | 365/185.17 |
| 2008/0084746 A1 * | 4/2008 | Park et al. | .............. | 365/185.17 |

\* cited by examiner

*Primary Examiner*—Pho M Luu
(74) *Attorney, Agent, or Firm*—Harness, Dickey & Pierce (57) ABSTRACT

Provided are a non-volatile memory device and a method of programming the same. The method includes: performing a program operation; performing a program verify read operation; and performing a pass/fail determine operation simultaneously with one of a verify recovery operation and a bit line setup operation, after the performing of the program verify read operation.

20 Claims, 10 Drawing Sheets

Loop #0: HV Enable | Data Load | B/L Setup | PGM EXE | Core RCV | Verify Read | Verify RCV | Wired-OR Loop #1: B/L Setup | PGM EXE | Core RCV | Verify Read | Verify RCV | Wired-OR

· · ·

Loop #n: B/L Setup | PGM EXE | Core RCV | Verify Read | Verify RCV | Wired-OR | HV RCV

Fig. 6B

Loop #0: HV Enable | Data Load | B/L Setup | PGM EXE | Core RCV | Verify Read | Verify RCV / Wired-OR Loop #1: B/L Setup | PGM EXE | Core RCV | Verify Read | Verify RCV / WiredOR

...

Loop #n: B/L Setup | PGM EXE | Core RCV | Verify Read | Verify RCV / WiredOR | HV RCV

NON-VOLATILE MEMORY DEVICE AND A METHOD OF PROGRAMMING THE SAME

FOREIGN PRIORITY STATEMENT

This U.S. non-provisional patent application claims priority under 35 U.S.C. §119 to Korean Patent Application No. 10-2007-0073614, filed on Jul. 23, 2007, in the Korean Intellectual Property Office (KIPO) the entire contents of which are incorporated herein by reference.

BACKGROUND

Example embodiments relate to a non-volatile memory device, and more particularly, to a non-volatile memory device and a method of programming the same.

A non-volatile memory device, for example a mask read-only memory (MROM), a programmable read-only memory (PROM), an erasable programmable read-only memory (EPROM), an electrically erasable programmable read-only memory (EEPROM), etc., may retain its stored data even if there is no power supply. The data stored state of a non-volatile memory may be permanent or reprogrammable according to applicable manufacturing techniques. A non-volatile memory device may be used for storing programs and microcodes in a wide range of applications, for example computers, avionics, communications, and consumer electronic technology industries. If a system requires a non-volatile memory that is reprogrammable and is capable of promptly combining of volatile and non-volatile memory storing modes in a single chip, a non-volatile RAM (nvRAM) may be used for the system. Moreover, a certain memory structure with additional logic circuits has been developed and may optimize performance for an application oriented task.

With non-volatile semiconductor memory devices like MROM, PROM, and EPROM, it may not be easy to erase and write data, and a general user may experience difficulties in updating memory contents. Contrarily, EEPROM may erase and write data electrically without difficulty and may become widely used in system programming for continuous updating and also auxiliary memory devices.

A flash EEPROM (hereinafter, referred to as a flash memory) may have a higher degree of integration compared to a conventional EEPROM, such that it may be advantageous for a high capacity auxiliary memory device. Among flash memories, a NAND flash memory may have a higher degree of integration than a NOR flash memory.

Flash memory may be classified into NOR flash memory and NAND flash memory depending on connection states between a cell and a bit line. Generally, because the NOR flash memory may have high power consumption, it may be disadvantageous for a high degree of integration, but it may be advantageous for a high speed operation. Additionally, since the NAND flash memory may consume a relatively small cell current, it may be advantageous for a high degree of integration.

Data in memory cells of a NAND flash memory may be erased and programmed through a Fowler-Nordheim tunneling current. On the other hand, a flash memory device may be programmed through an incremental step pulse programming (ISPP) scheme to accurately control threshold voltage distribution.

To store data in a memory cell array, a data load instruction may be given to a flash memory first, and then an address and data may be continuously inputted into the flash memory. Generally, data to be programmed may be sequentially transmitted to a page buffer by a byte or word unit. When all the data to be programmed, i.e., one page amount of data, are loaded in the page buffer, the stored data in the page buffer may be simultaneously programmed memory cells of a selected page in the memory cell array according to a program instruction. Generally, a cycle during which data may be programmed may be called a program cycle and may include a plurality of program loops, and each program loop may be divided into a program interval and a program verify interval.

During the program interval, memory cells may be programmed according to a well-known method under bias conditions. During the program verify interval, it may be verified whether memory cells are programmed up to a desired threshold voltage or not. The program loops may be repeatedly performed a predetermined number of times or until all the memory cells are programmed.

A program verify operation may be identical to a read operation except that read data may not be outputted to the outside. There are various suggested verifying methods that may determine whether memory cells are programmed up to a desired threshold voltage or not. One of the various verifying methods may be a wired-OR type.

A flash memory device may include a program state detection circuit. The program state detection circuit may simultaneously receive data stored in a latch of a page buffer and may detect whether the inputted data values represent program data values or not during a program verify interval. For example, the program state detection circuit may output a normal detect signal when all the selected memory cells are programmed to the optimized state, or may output an abnormal detect signal when at least one of the selected memory cells is insufficiently programmed.

SUMMARY

Example embodiments may provide a non-volatile memory device which may shorten programming time and a method of programming the same.

Example embodiments may provide a programming method that may include performing a recovery operation and a pass/fail verify operation simultaneously right after performing a verify read operation.

Example embodiments may provide a programming method that may include performing a bit line setup operation and a pass/fail verify operation simultaneously.

Example embodiments may provide a method of programming a non-volatile memory device which may include: performing a program operation; performing a program verify read operation; and simultaneously performing a verify recovery operation and a pass/fail determine operation after the performing of the program verify read operation.

According to example embodiments, a wired-OR scheme may be used during the pass/fail determine operation.

According to example embodiments, the pass/fail determine operation may be performed after detecting data through a plurality of bit lines during the program verify read operation.

According to example embodiments, after the detecting of the data, the bit lines may be electrically cut off from latches of a page buffer corresponding to the bit lines.

According to example embodiments, a program voltage may be provided during the performing of the program operation, and the program voltage may be incrementally increased according to a program loop.

According to example embodiments, the performing of the program operation may include: activating a high voltage generation circuit to generate word line voltages and bit line voltages necessary for programming the non-volatile memory device; and loading data to be programmed.

According to example embodiments, the performing of the program operation may further include performing a bit line setup operation to provide a ground voltage as a program voltage to bit lines connected to a memory cell to be programmed and a power supply voltage as a program inhibit voltage to bit lines connected to a memory cell to be program inhibited.

According to example embodiments, the performing of the program operation may further include performing a program execute operation to provide a program voltage to a selected word line and a pass voltage to non-selected word lines in order to program the loaded data.

According to example embodiments, the methods may further include performing a core recovery operation to discharge a voltage level of the word lines and the bit lines into a ground voltage after the performing of the program operation.

According to example embodiments, the methods may further include: deactivating the high voltage generation circuit; and completing the program operation if program pass occurs as a result of the pass/fail determine operation.

According to example embodiments, the methods may further include: increasing a program loop counter value if program fail occurs as a result of the pass/fail determine operation; and repeating the program operation with an increased program voltage.

According to example embodiments, the methods may further include completing the program operation when the program loop counter value exceeds a reference value.

According to example embodiments, the methods may further include performing a verify recovery operation after the performing of the program verify read operation.

According to example embodiments, methods of programming a non-volatile memory device may include: performing a program operation; performing a program verify read operation; and simultaneously performing a bit line setup operation and a pass/fail determine operation after the performing of the program verify read operation.

According to example embodiments, a wired-OR scheme may be used during the pass/fail determine operation.

According to example embodiments, a program voltage may be provided during the performing of the program operation, and the program voltage may be incrementally increased according to a program loop.

According to example embodiments, the performing of the program operation may include: activating a high voltage generation circuit to generate word line voltages and bit line voltages necessary for programming the non-volatile memory device; and loading data to be programmed.

According to example embodiments, the performing of the program operation may further include performing a bit line setup operation to provide a ground voltage as a program voltage to bit lines connected to a memory cell to be programmed and a power supply voltage as a program inhibit voltage to bit lines connected to a memory cell to be program inhibited.

According to example embodiments, the performing of the program operation may further include performing a program execute operation to provide a program voltage to a selected word line and a pass voltage to non-selected word lines in order to program the loaded data.

According to example embodiments, the methods may further include performing a core recovery operation to discharge a voltage level of the word lines and the bit lines into a ground voltage after the performing of the program operation.

According to example embodiments, the verify read operation may be performed after the performing of the core recovery operation.

According to example embodiments, the bit line setup operation and the pass/fail determine operation may be simultaneously performed after the performing of the verify read operation.

According to example embodiments, the methods may further include: deactivating the high voltage generation circuit; and completing the program operation if program pass occurs as a result of the pass/fail determine operation.

According to example embodiments, the methods may further include: increasing a program loop counter value if program fail occurs as a result of the pass/fail determine operation; and repeating the program operation with an increased program voltage.

According to example embodiments, the methods may further include completing the program operation when the program loop counter value exceeds a reference value.

According to example embodiments, non-volatile memory devices may include: a memory cell array which may include memory cells arranged on intersection regions of a plurality of word lines and a plurality of bit lines; a row decoder which may receive an address to select one among the word lines; a page buffer which may temporarily store data bits to be programmed in the memory cell array or temporarily store data bits detected from the memory cell array through the bit lines; a pass/fail check circuit which may determine whether data values latched in the page buffer are identical to pass data or not during a program verify operation; and a control logic which may control the row decoder, the page buffer, and the pass/fail check circuit to simultaneously perform a verify recovery operation and a pass/fail determine operation after a verify read operation during a program operation.

According to example embodiments, a wired-OR scheme may be used during the pass/fail check circuit.

According to example embodiments, the pass/fail check circuit may include: a precharger which may precharge a check node to a power supply voltage level in response to a precharge enable signal; a developer which may develop data into the check node in response to a developer enable signal, the data being latched in the page buffer; and a latcher which may latch a voltage level of the check node in response to a latch enable signal, wherein the precharge enable signal, the developer enable signal, and the latch enable signal may be generated from the control logic during the pass/fail determine operation.

According to example embodiments, non-volatile memory devices may include: a memory cell array which may include memory cells arranged on intersection regions of a plurality of word lines and a plurality of bit lines; a row decoder which may receive an address to select one among the word lines; a page buffer which may temporarily store data bits to be programmed in the memory cell array or temporarily store data bits detected from the memory cell array through the bit lines; a pass/fail check circuit which may determine whether data values latched in the page buffer are identical to pass data or not during a program verify operation; and a control logic which may control the row decoder, the page buffer, and the pass/fail check circuit to simultaneously perform a bit line setup operation and a pass/fail determine operation after a verify read operation during a program operation.

According to example embodiments, memory systems may include: the above non-volatile memory device; and a memory controller which may control the non-volatile memory device.

According to example embodiments, the non-volatile memory device may be a NAND flash memory device.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF PREFERRED EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

According to example embodiments, a non-volatile memory device may simultaneously perform a recovery operation and a pass/fail determine operation during a program operation right after performing a verify read operation. The non-volatile memory device may simultaneously perform a bit line setup operation and a pass/fail determine operation during a program operation. Accordingly, a program operation time of the non-volatile memory device may be shortened.

Figure 1:
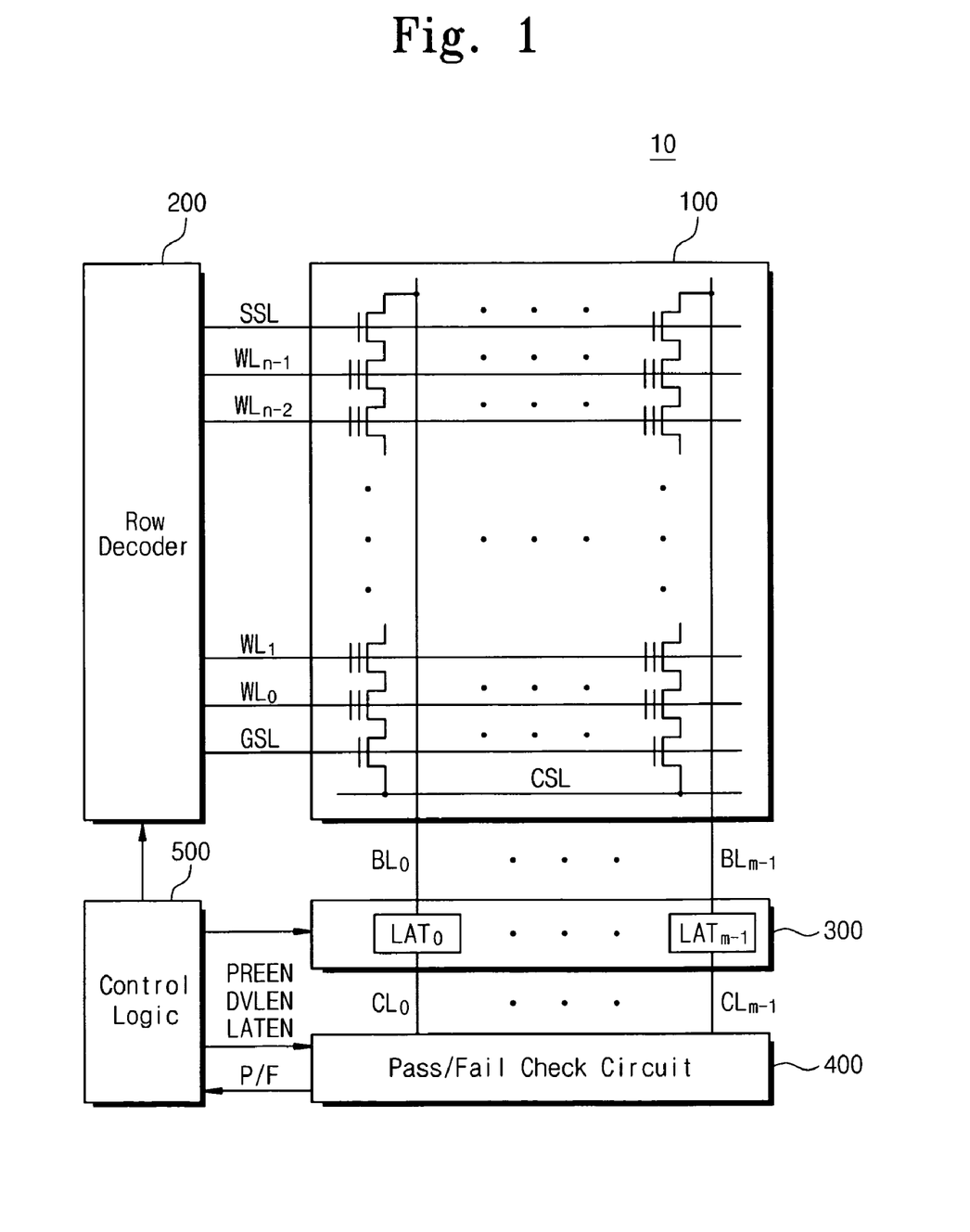
FIG. 1 is a block diagram of a non-volatile memory device 10 according example embodiments.

FIG. 1 is a block diagram of a non-volatile memory device 10 according to example embodiments. For example, the non-volatile memory device 10 of FIG. 1 may be a NAND flash memory. However, it is apparent to those skilled in the art that example embodiments are applicable to other memory devices for example, a mask read-only memory (MROM), a programmable read-only memory (PROM), a ferroelectric random access memory (FRAM), a NOR flash memory, etc.

Referring to FIG. 1, the non-volatile memory device 10 may include a memory cell array 100, a row decoder 200, a page buffer 300, a pass/fail check circuit 400, and a control logic 500. In a case of the non-volatile memory device 10, an additional interval for a pass/fail determine operation may not be set up during a program operation. During a program operation, a pass/fail determine operation may be performed together with a recovery operation or a bit line setup operation after a verify read operation.

The memory cell array 100 may be a storage region for storing information. Memory cells in the memory cell array 100 may be respectively arranged on intersection areas between a plurality of word lines and a plurality of bit lines. Each of the memory cells may stores 1-bit data or n-bit data (n may be an integer equal to or larger than 2). Though only one memory block is illustrated in FIG. 1, the memory cell array 100 may include a plurality of memory blocks. Referring to FIG. 1, each of the memory blocks in the memory cell array 100 may include a plurality of cell strings. Each of the cell strings may include a plurality of floating gate transistors.

The floating gate transistors may be connected in series between a string selection transistor SST and a ground selection transistor GST in each string. A plurality of word lines WL0 to WLn-1 may be arranged to intersect each string. The word lines WL0 to WLn-1 may be respectively connected to control gates of the corresponding floating gate transistors in each string. Since a program/read voltage may be applied to a selected word line, it data may be programmed or read to or from a selected floating gate transistor. A flash memory may further include a page buffer to store data in the memory cell array 100 or read the stored data from the page buffer.

The row decoder 200 may decode a row address provided from a row address buffer (not shown), and may select one of the word lines according to a decoding result. A word line voltage may be applied to the selected word line according to an operation mode. For example, the word line voltage may include a word line program voltage, a pass voltage, a verify voltage, an erase voltage, a read voltage, etc.

The page buffer 300 may detect data from a page of the memory cell array 100 and may then store the detected data, or may temporarily store data to be programmed in a selected page. The page buffer 300 may be controlled by the control logic 500 in order to operate as a detection amplifier or a write driver according to an operation mode. The page buffer 300 may detect data from memory cells of a selected word line through the bit lines BL0 to BLm-1 during a read/verify operation, and may apply a power supply voltage or a program-inhibit voltage, or a ground voltage or a program voltage to the bit lines BL0 to BLm-1 according to data to be programmed during a program operation.

The page buffer 300 may include page buffers that may correspond to the bit lines BL0 to BLm-1, respectively. Or, each page buffer may share a pair of bit lines. The page buffer 300 may include a plurality of latches LAT0 to LATm-1. The latches LAT0 to LATm-1 may latch data transmitted from the outside during a program operation. The latches LAT0 to LATm-1 may detect data from the memory cell array 100 and latch them during a read/verify operation. The data read during a read operation may be outputted to the outside through a data input/output circuit (not shown). On the contrary, the data read during a verify operation may be outputted to the pass/fail check circuit 400 through check lines CL0 to CLm-1.

The pass/fail check circuit 400 may determine whether data values latched in the latches LAT0 to LATm-1 of the page buffer 300 may be identical to pass data during a program operation. The pass/fail check circuit 400 may output a pass/fail signal P/F as a program verification result to the control logic 500. The pass/fail determine operation may use a wired-OR type. During a program/erase operation, the pass/fail check circuit 400 may perform a pass/fail determine operation in response to signals PREEN, DVLEN, LATEN which may be transmitted from the control logic 500. Example embodiments will now be described with reference to FIGS. 2 and 3.

The control logic 500 may receive control signals (e.g., CE, RE, WE, CLE, ALE, WP, etc.) from an external memory controller (not shown) and may control all operations related to program/erase/read/verify operations of the memory cells in the non-volatile memory cell array 100. The control logic 500 may include a high voltage generation circuit (not shown) which may generate a high voltage necessary for program/erase/read/verify operations of the memory cells.

For example, the high voltage generation circuit may apply a program voltage to a selected word line during a program operation, and a pass voltage to a non-selected word line. The high voltage generation circuit may apply a read voltage to a selected word line, and a ground voltage to a non-selected word line during a read operation. The control logic 500 may generate signals PREEN, DVLEN, and LATEN to perform a pass/fail determine operation, and may then transmit the generated signals to the pass/fail check circuit 400 during a program/erase verify operation.

The control logic 500 according to example embodiments may control the row decoder 200, the page buffer 300, and the pass/fail check circuit 400 in order to simultaneously perform a recovery operation and a pass/fail determine operation after a verify read operation. That is, after performing the verify read operation, the control logic 500 may perform a recovery operation and a pass/fail determine operation simultaneously. The recovery operation may discharge the word lines and bit lines to a ground voltage level. At this point, because the bit lines BL0 to BLm-1 may be electrically disconnected to the corresponding latches LAT0 to LATm-1, the recovery operation and the pass/fail verify operation may not affect each other.

On the other hand, the control logic 500 may control the page buffer 300 and the pass/fail check circuit 400 in order to simultaneously perform a bit line setup operation and a pass/fail determine operation after performing a verify read operation.

The non-volatile memory device 10 according to example embodiments may perform a pass/fail determine operation together with the recovery operation or may perform a pass/fail determine operation together with a bit line setup operation, after performing a verify read operation. Accordingly, the non-volatile memory device 10 may not require additional time for the pass/fail determine operation.

Figure 2:
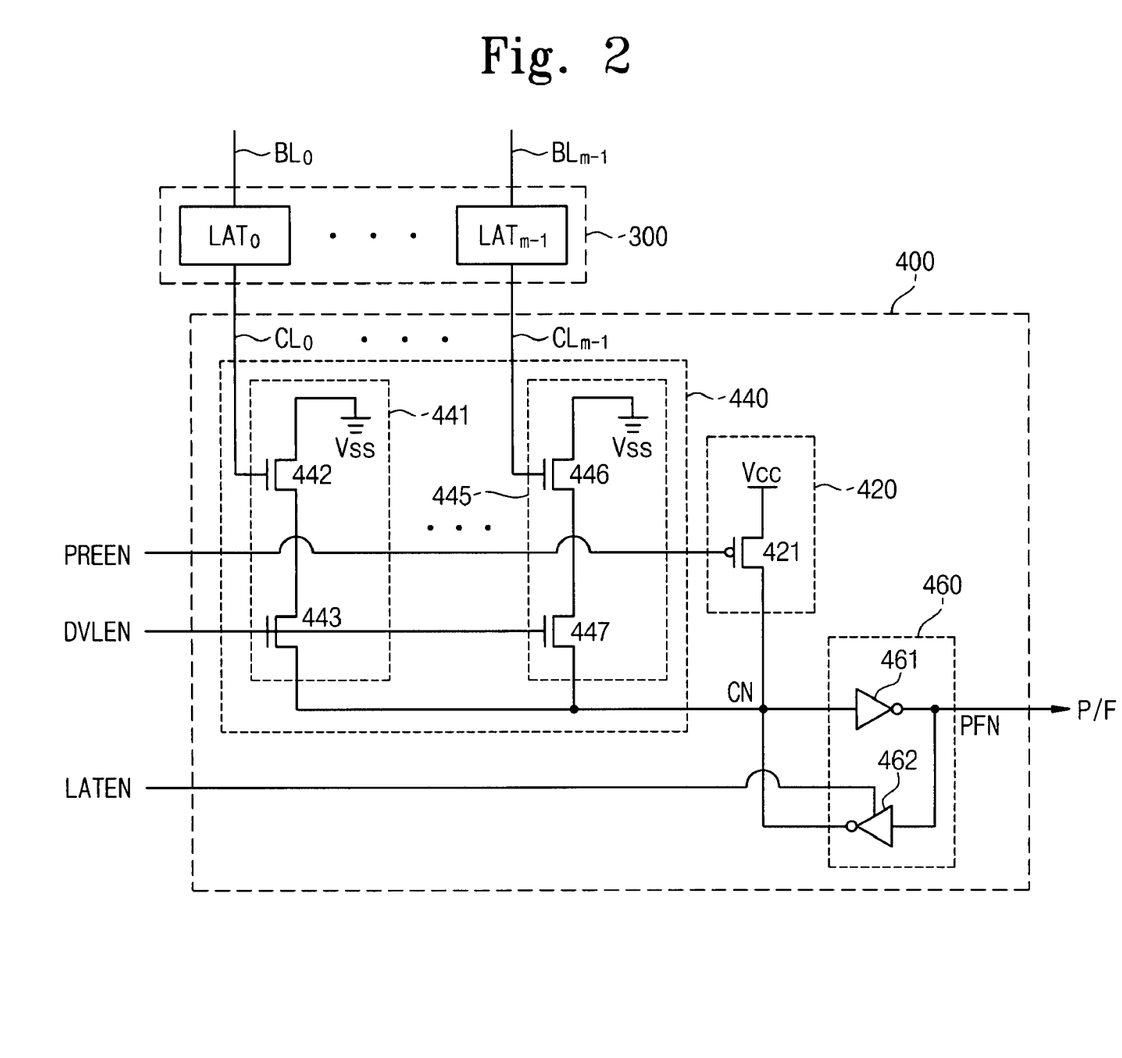
FIG. 2 is a circuit diagram of a pass/fail check circuit according to example embodiments.

FIG. 2 is a circuit diagram of a pass/fail check circuit 400 according to example embodiments. A program operation will be described with reference to FIGS. 1 and 2. Referring to FIG. 2, the pass/fail check circuit 400 may include a pre-charger 420, a developer 440, and a latch unit 460. During a program operation, the pass/fail check circuit 400 may generate a signal P/F to determine program pass/fail in response to signals PREEN, DVLEN, and LATEN transmitted from the control logic 500.

The pre-charger 420 may charge a check node CN to a level of a power supply voltage Vcc in response to a precharge enable signal PREEN. The pre-charger 420 may include a positive channel metal oxide semiconductor (PMOS) transistor 421. The PMOS transistor 421 may include a source to which a power supply voltage Vcc is applied, a drain connected to the check node CN, and a gate receiving a precharge enable signal PREEN. If the precharge enable signal PREEN of a low level is inputted, the check node CN may have a level of a power supply voltage Vcc.

The developer 440 may develop data latched in the latches LAT0 to LATm-1 of the page buffer 300 in response to a developer enable signal DVLEN. The developer 440 may include a plurality of developer circuits, however only two developer circuits 441 and 445 are illustrated in FIG. 2. The developer circuits 441 and 445 may include two NMOS transistors 442, 443, and two NMOS transistor 446, and 447, respectively. The first NMOS transistors 442 and 446 may be turned on/off according to latched data in each of the latches LAT0 to LATm-1. Drains of the first NMOS transistors 442 and 446 may be connected to a ground voltage Vss. The second NMOS transistors 443 and 447 may be turned on/off in response to a developer enable signal DVLEN. If latched data in any one of the latches LAT0 to MATm-1 is 1, the corresponding first NMOS transistor may be turned on. If a developer enable signal DVLEN of a high level is inputted, the check node CN may have a level of a ground voltage Vss. This may indicate program fail.

The latcher 460 may latch a voltage level of the check node CN in response to the latch enable signal LATEN to output a pass/fail signal P/F which may determine program pass or fail. The latcher 460 may be realized by two inverters 461 and 462 as illustrated in FIG. 2. The inverter 462 may be activated in response to the latch enable signal LATEN. That is, the latcher 460 may detect a voltage level of the check node CN, and may then output a signal in response to the latch enable signal LATEN of a high level. If the check node CN has a voltage level of the power supply voltage Vcc, the latcher 460 may output a pass/fail signal P/F of a low level. This may indicate that a program operation completed normally. On the contrary, if the check node CN has a level of a ground voltage Vss, the latcher 460 may output a pass/fail signal P/F of a high level. This may indicate that a program operation completed abnormally.

Figure 3:
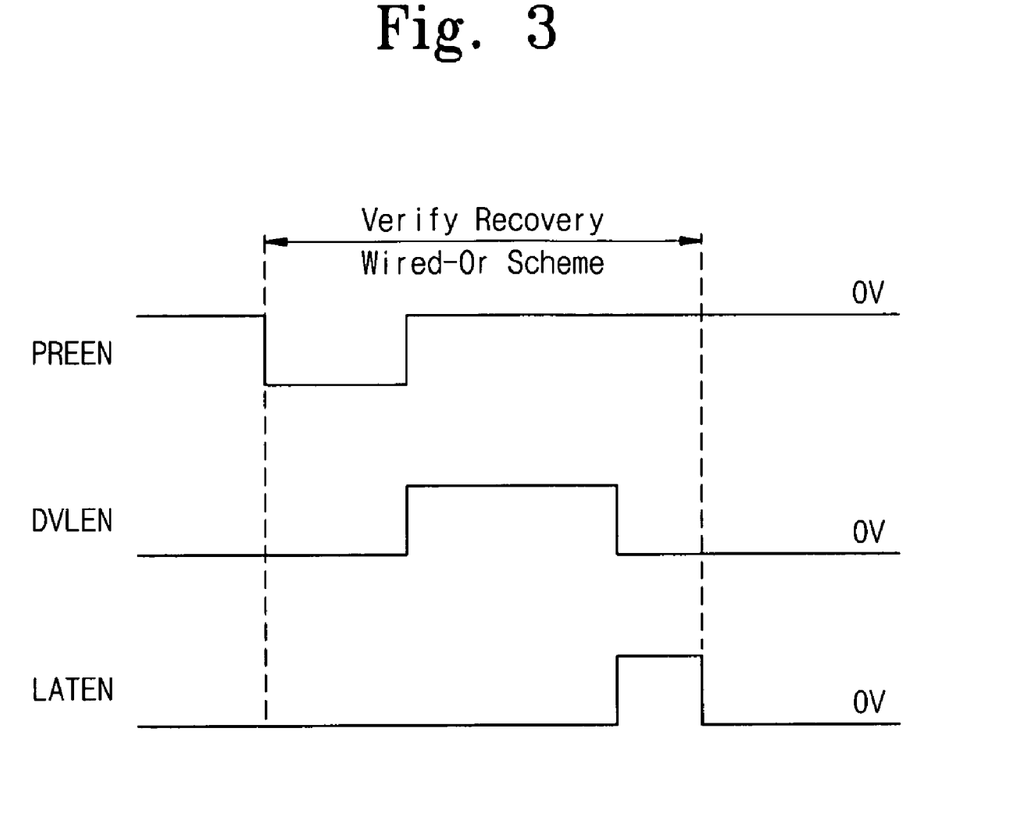
FIG. 3 is a timing diagram of inputted signals during a pass/fail determine operation.

FIG. 3 is a timing diagram of inputted signals during a pass/fail determine operation. Referring to FIG. 3, a pass/fail determine operation and a verify recovery operation may be simultaneously performed. According to example embodiments, while the verify recovery operation is performed, the pass/fail check circuit 400 may perform the pass/fail determine operation in response to a precharge enable signal PREEN, a developer enable signal DVLEN, and a latch enable signal LATEN.

Figure 4:
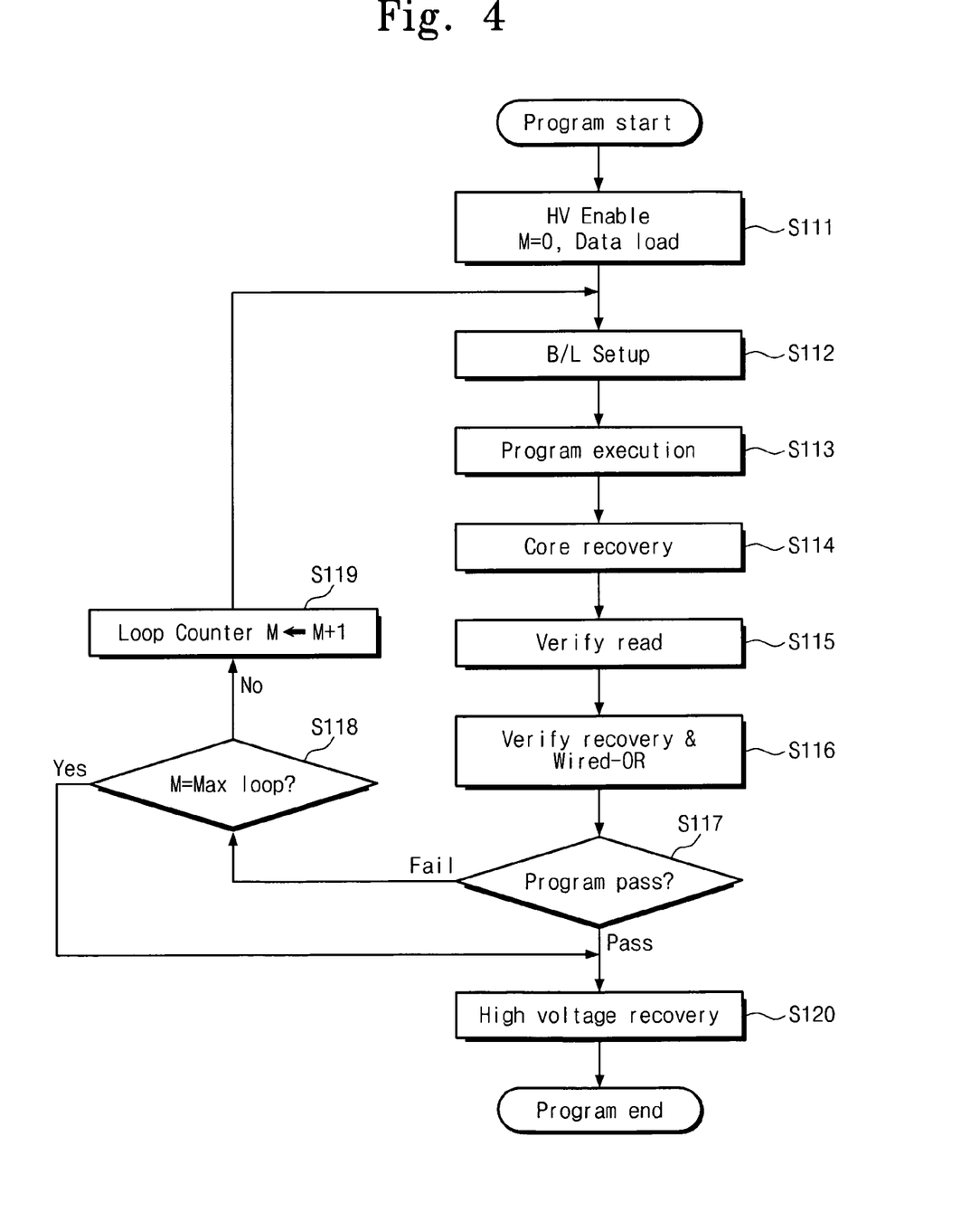
FIG. 4 is a flowchart of a programming method according to example embodiments.

FIG. 4 is a flowchart of a programming method according to example embodiments. Hereinafter, a method of programming a non-volatile memory device according to example embodiments will be described in more detail with reference to the drawings. Prior to the operation description, it is apparent that once the non-volatile memory device enters a program operation mode, a plurality of program loops may be automatically performed according to a control of the control logic 500. Each program loop may include a program interval and a program verify interval. During the program interval, memory cells of a selected page may be programmed according to the loaded data values in the page buffer 300. During the program verify interval, it may be necessary to determine whether memory cells of the selected word line are normally programmed or not within the predetermined number of program loops. If not, the program operation may be completed as program fail.

In operation S111, once a program operation mode starts, the control logic 500 may activate a high voltage generation circuit and may generate voltages (e.g., a program voltage, a pass voltage, a verify voltage, a program inhibit voltage, etc.), which may be respectively provided to word lines and a bit line for a program operation in response to a program command which may be inputted from the outside. The row decoder 200 may activate word lines to be programmed in response to an address inputted from the outside. Additionally, the data to be programmed may be respectively loaded into the latches LAT0 to LATm-1 of the page buffer 300 in operation S111.

During a bit line setup interval in operation S112, the bit lines BL0 to BLm-1 may be charged with a power supply voltage Vcc or a ground voltage Vss according to the loaded data in the latches LAT0 to MATm-1. For example, the bit line connected to memory cells that will be programmed may be charged with a ground voltage Vss, and a bit line connected to the memory cell that will be program inhibited may be charged with a power supply voltage Vcc. For convenient description, let us suppose that if the loaded data is logic 1, a corresponding memory cell may be programmed, and if the loaded data is logic 0, the corresponding memory cell may be program inhibited. A detailed description in relation to a program inhibit operation is disclosed in U.S. Pat. No. 5,677,873 titled "METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN", which is incorporated herein as a reference.

During a program execution interval in operation S113, a program operation of a first program loop may be performed according to any well-known method. For example, a program voltage may be applied to a selected word line, and a pass voltage may be applied to non-selected word lines. After performing a program operation, a core recovery operation may be performed in operation S114. The core recovery operation may discharge electric charges in the word lines WL0 to WLn-1 and the bit lines BL0 to BLm-1 through a ground. After performing the core recovery operation, a verify read operation of a first loop may be performed in operation S115. Through the verify read operation, data values of all the memory cells in the selected word line may be read by the page buffer 300. The read data values may be latched in the latches LAT0 to LATm-1 of the page buffer 300. Next, the control logic 500 may cut off electrical paths between the latches LAT0 to LATm-1 and the respectively corresponding bit lines BL0 to BLm-1.

According to example embodiments, operation S116 may include performing the verify recovery operation and the pass/fail determine operation simultaneously after performing the verify read operation. The verify recovery operation may discharge electrical charges through a ground, which may be stored in the latches LAT0 to LATm-1 and the respectively corresponding bit lines BL0 to BLm-1 during the verify read operation. On the other hand, because the bit lines BL0 to BLm-1 may be electrically disconnected to the latches LAT0 to LATm-1, the verify recovery operation and the pass/fail determine operation may be performed simultaneously. A well-known wired-OR type may be used for the pass/fail determine operation. A memory device using the wired-OR type is disclosed in U.S. Pat. No. 5,299,162 titled "NON-VOLATILE SEMICONDUCTOR MEMORY DEVICE AND AN OPTIMIZING PROGRAMMING METHOD THEREOF", which is hereby incorporated by reference.

After performing the pass/fail determine operation, if it is program pass in operation S117, a high voltage recovery operation may be performed to deactivate the high voltage generation circuit in operation S120, and then the program operation may be completed. On the contrary, according to a result of the pass/fail determine operation, if it is program fail in operation S117, it may be determined whether the current program loop reaches the maximum number of program loops or not in operation S118. If the program loop reaches the maximum number, the high voltage recovery operation may be performed in operation S120, and then the program operation may be completed. If the program loop does not reach the maximum number, a loop counter value may be increased in operation S119, and the loop counter may start again from the bit line setup operation in operation S112. The next program execute operation may be performed with a predetermined voltage level, which may be increased in accordance with the counter value of the repeated program loop. The method of increasing a program voltage during loop reiteration is titled "A 3.3V 32 Mb NAND FLASH MEMORY WITH INCREMENTAL STEP PULSE PROGRAMMING SCHEME" (By Suh, Kang-Deong et al.) and is disclosed in IEEE International Solid-State Circuits conference, 1995, pp. 128-120, which is incorporated herein by reference. The above described processes will repeat until program pass.

The programming method according to example embodiments may include performing the pass/fail determine operation together with the verify recovery operation. Accordingly, the programming method according to example embodiments may not require additional time for the pass/fail determine operation. Therefore, a programming time may be reduced by that amount.

Figure 5:
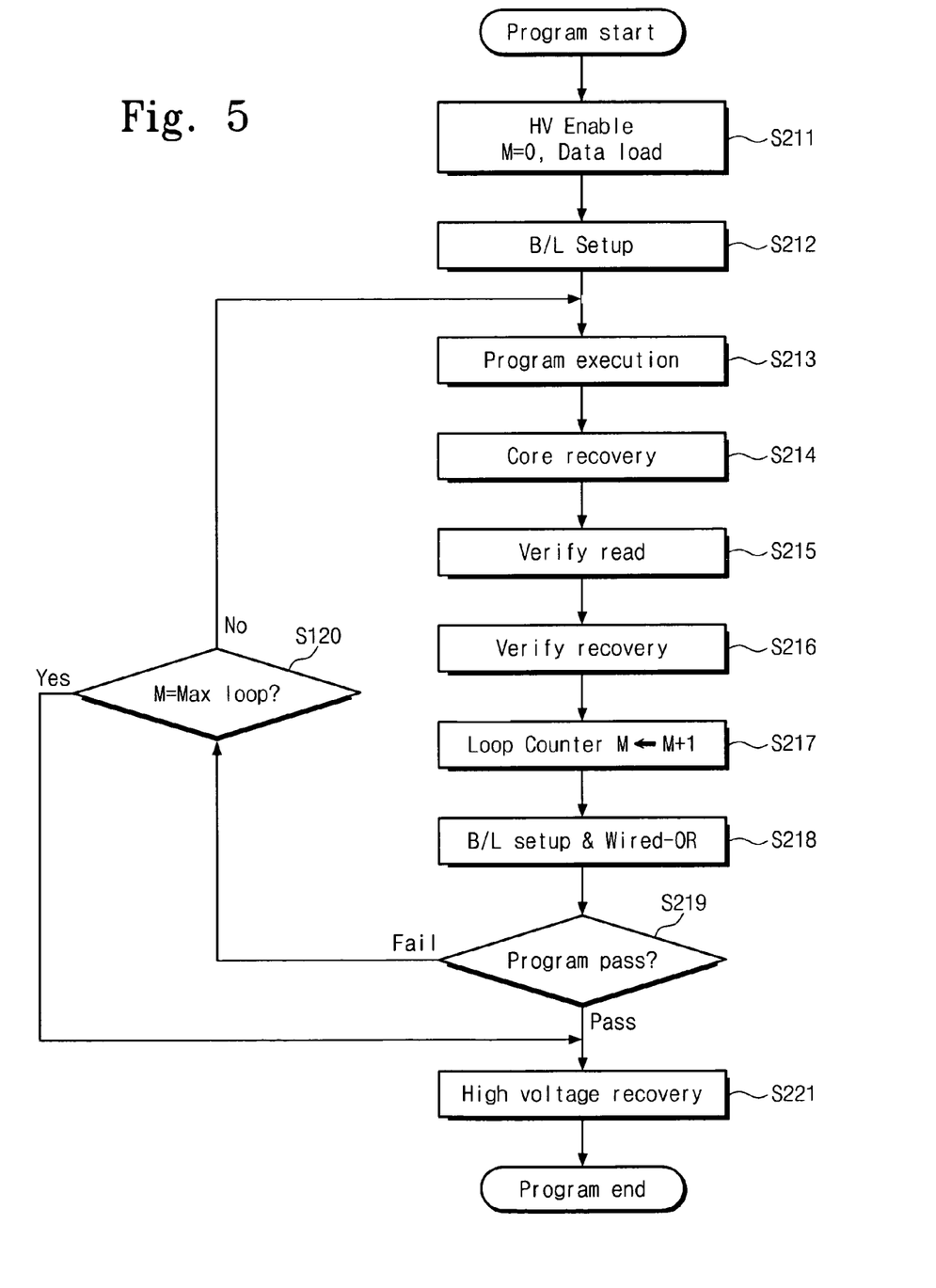
FIG. 5 is flowchart of a programming method according to example embodiments.

In FIG. 4, the pass/fail determine operation may be performed together with the verify recovery operation. However, the interval of the pass/fail determine operation may not need to be necessarily limited thereto. FIG. 5 is flowchart of a programming method according to example embodiments. Referring to FIG. 5, the programming method according to example embodiments may include performing a bit line setup operation and a pass/fail determine operation simultaneously in operation S218 right after performing a first program loop.

Figure 6A:
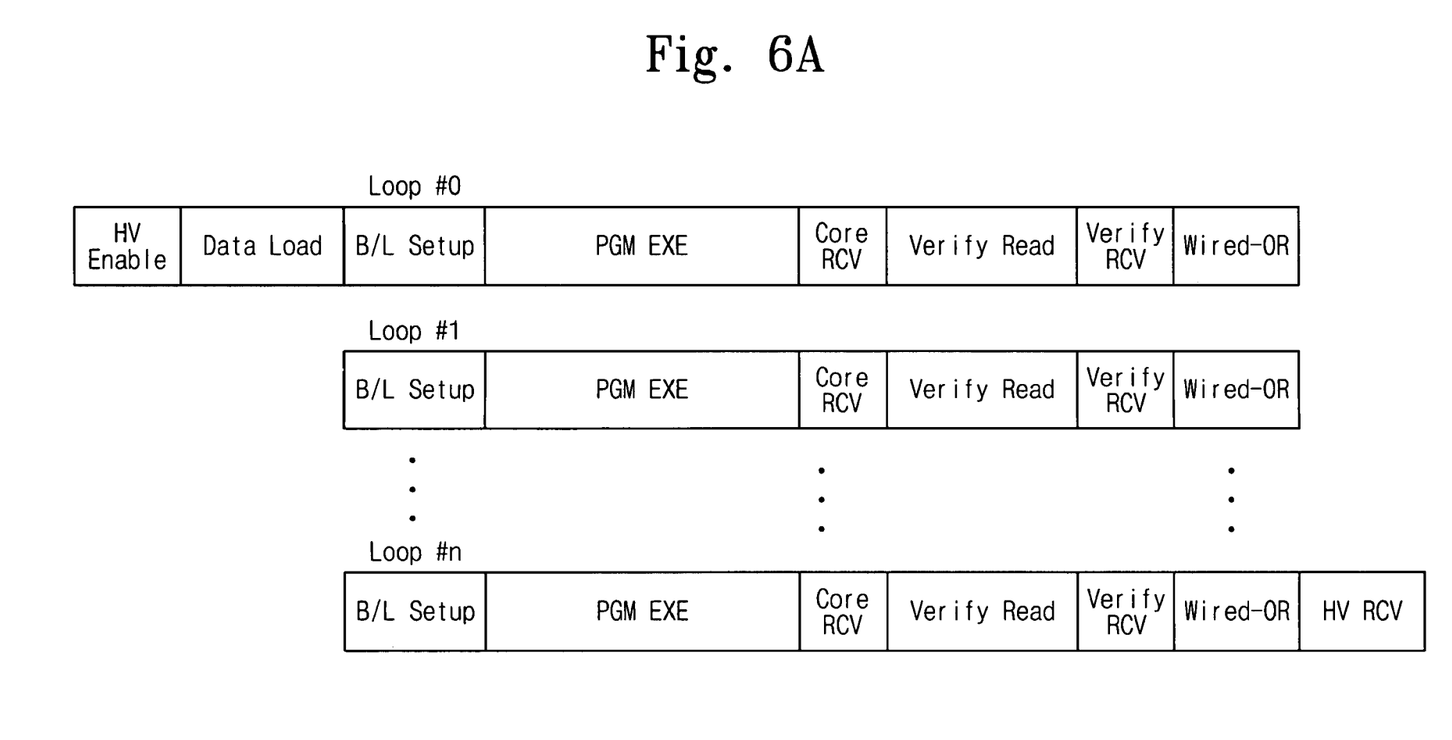
FIGS. 6A through 6C are views for comparing programming times between a non-volatile memory device according to example embodiments and a conventional non-volatile memory device.
Figure 6B:
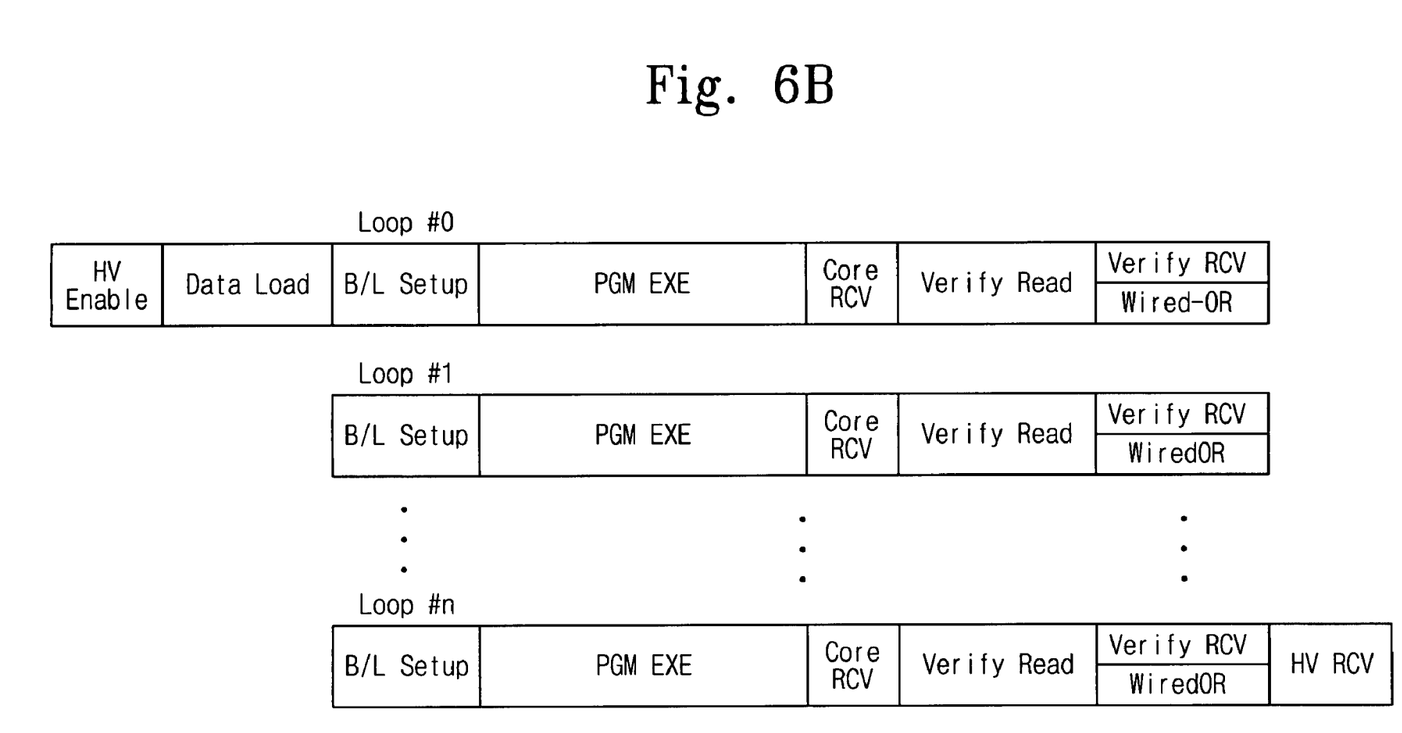
Figure 6C:
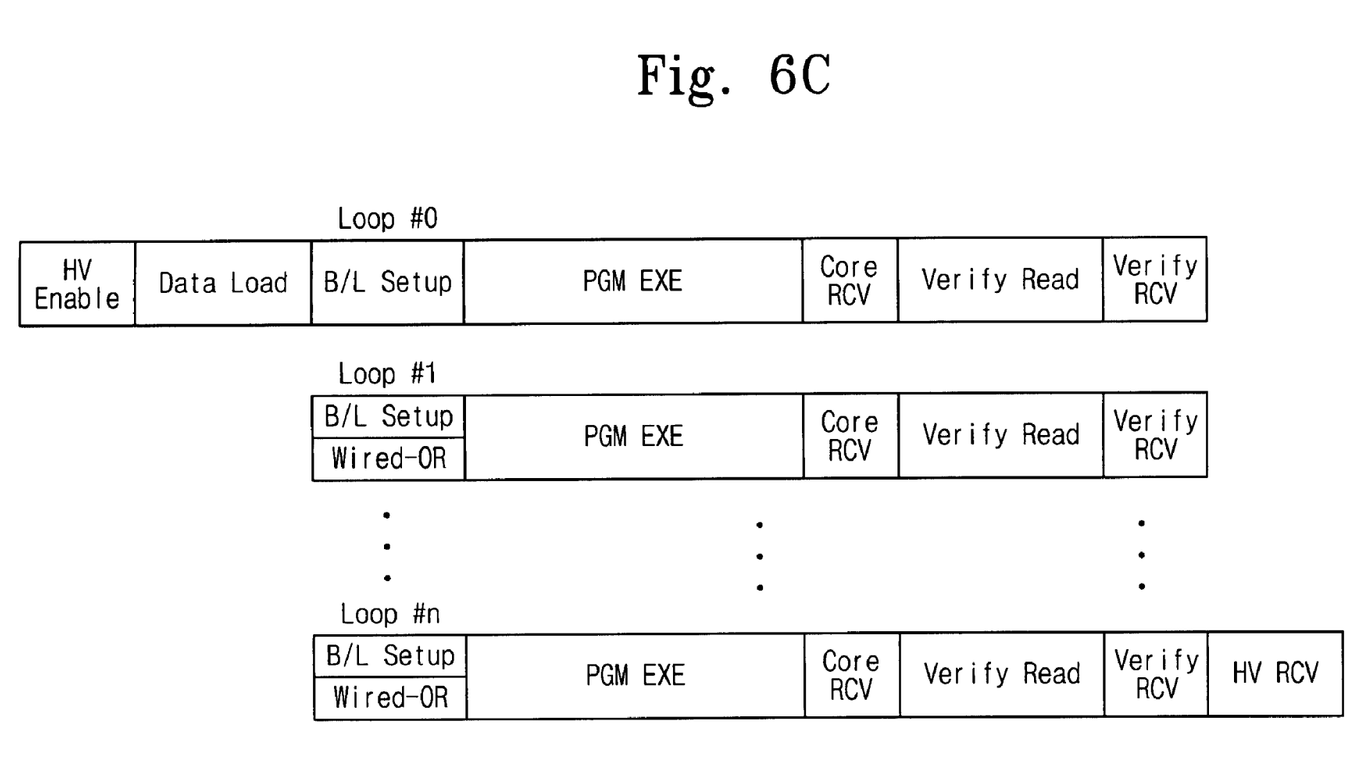

FIGS. 6A through 6C are views for comparing programming times of a non-volatile memory device according to example embodiment with programming times of a typical non-volatile memory device. FIG. 6A illustrates the programming time of the typical non-volatile memory device. FIGS. 6B and 6C illustrate the programming times of the non-volatile memory device according to example embodiments.

Generally, the programming time of a non-volatile memory device may be divided into a high voltage activation interval, a data loading interval, a bit line setup interval, a program execution interval, a core recovery interval, a verify read interval, a verify recovery interval, a pass/fail determination interval, and a high voltage recovery interval. In the example depicted in FIGS. 6A-6C, the bit line setup interval through the pass/fail determination interval may be repeated in accordance with a program loop. Referring to FIG. 6A, the programming time of a typical non-volatile memory device may include an additional pass/fail determination interval at each program loop. On the contrary, referring to FIGS. 6B and 6C, the programming time of the non-volatile memory device according to example embodiments may not include additional pass/fail determination interval. Referring to FIG. 6B, the verify recovery interval and the pass/fail determination interval may be at the same position during the programming time of the non-volatile memory device. Referring to FIG. 6C, the bit line setup interval and the pass/fail determination interval may be the same position during the programming time of the non-volatile memory device. Therefore, the overall programming time may become shortened in the non-volatile memory device according to example embodiments.

Figure 7:
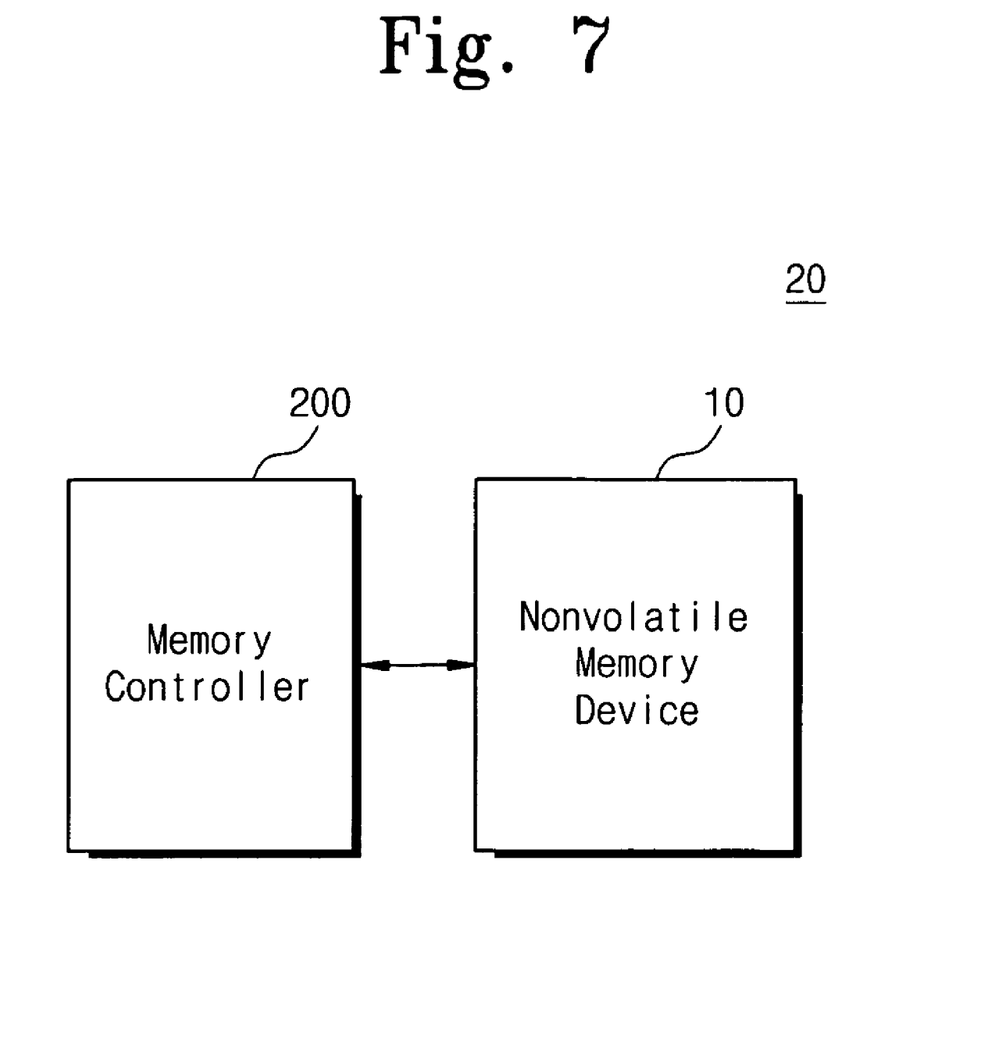
FIG. 7 is a block diagram of a memory system including a non-volatile memory device according to example embodiments.

FIG. 7 is a block diagram of a memory system 20 including the non-volatile memory device 10 according to example embodiments. Referring to FIG. 7, the memory system 20 may include the non-volatile memory device 10 and a memory controller 200. The memory controller 200 may provide control information to the nonvolatile memory device 10 The non-volatile memory device 10 may be identical to the non-volatile memory device 10 of FIG. 1.

Figure 8:
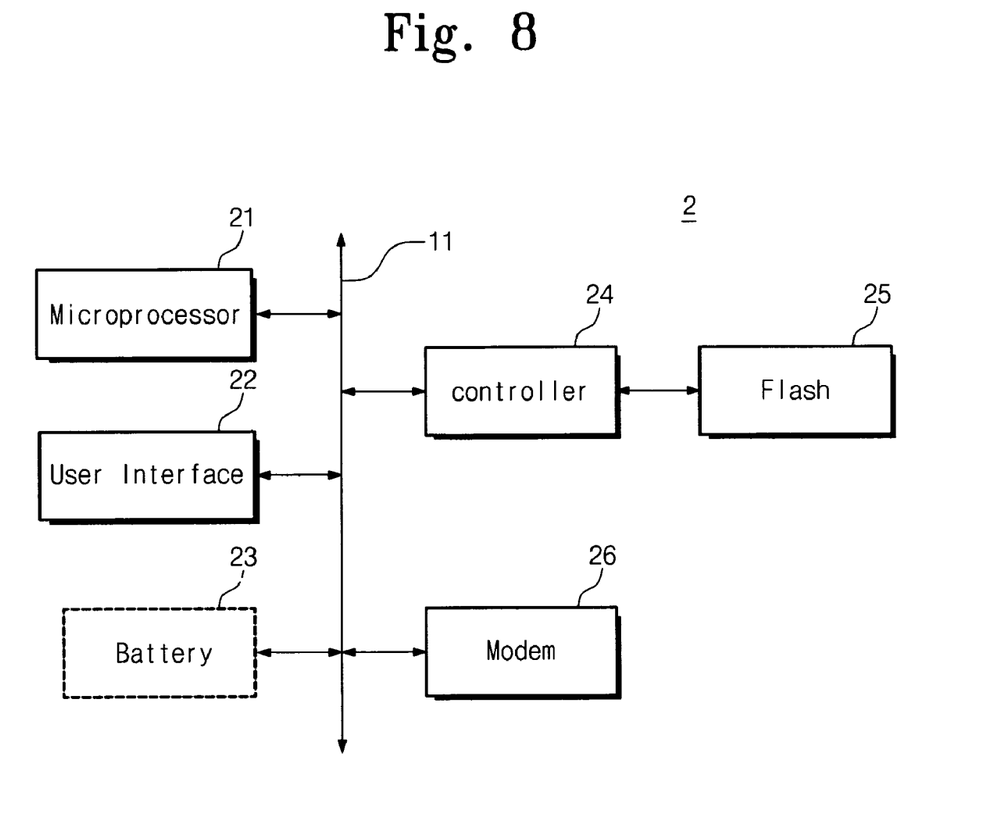
FIG. 8 is a view of a computing system including a flash memory device and a memory controller according to example embodiments.

A flash memory device of FIG. 8 may be a non-volatile memory device which may retain stored data even when there is no power supply. As usages of mobile devices, for example mobile phones, PDAs, digital cameras, portable game consoles, MP3 players, etc. may increase, a flash memory device may be extensively used as data storage and code storage. The flash memory device further may be used in home applications, for example HDTVs, DVDs, routers, and GPSs.

FIG. 8 is a view of a computing system including a flash memory device and a memory controller according to example embodiments. A computing system 2 according to example embodiments may include a microprocessor 21, a user interface 22, a modem 26, for example a baseband chipset, a memory controller 24, and a flash memory device 25, which may be electrically connected to each other through a bus 11. The flash memory device 25 may substantially have the same structure as the non-volatile memory device of FIG. 1. The flash memory device 25 may store N-bit data (N may be an integer equal to or larger than 1), which may be processed already or processed in the future by the microprocessor 21, according to a control of the memory controller 24.

In a case where the computing system according to example embodiments is a mobile system, a battery 23 may be additionally provided to supply an operation voltage of the computing system. Although not illustrated in the drawings, it is apparent to those skilled in the art that the computing system according to example embodiments may further include an application chipset, a camera image processor (CIS), a mobile DRAM, etc. The memory controller and flash memory device, for example, may include a solid state drive/disk (SSD) that uses a non-volatile memory for storing data.

The flash memory device and/or the memory controller according to example embodiments may be mounted through various forms of packages. For example, the various forms of packages may include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

According to example embodiments, the non-volatile memory device may simultaneously perform a recovery operation and a pass/fail determine operation, or may simultaneously perform a bit line setup operation and a pass/fail determine operation, during a program operation. Accordingly, the non-volatile memory device according to example embodiments may not require additional time for a pass/fail determine operation. Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of programming a non-volatile memory device, the method comprising:
    performing a program operation;
    performing a program verify read operation; and
    performing one of a verify recovery operation and a bit line setup operation simultaneously with a pass/fail determine operation, after the performing of the program verify read operation.

2. The method of claim 1, wherein the verify recovery operation and the pass/fail determine operation are simultaneously performed.

3. The method of claim 2, wherein a wired-OR scheme is used during the pass/fail determine operation.

4. The method of claim 3, wherein the pass/fail determine operation is performed after detecting data through a plurality of bit lines during the program verify read operation.

5. The method of claim 4, wherein, after the detecting of the data, the bit lines are electrically cut off from latches of a page buffer corresponding to the bit lines.

6. The method of claim 2, wherein a program voltage is provided during the performing of the program operation, the program voltage being incrementally increased according to a program loop.

7. The method of claim 6, wherein the performing of the program operation comprises:
activating a high voltage generation circuit to generate word line voltages and bit line voltages necessary for programming the non-volatile memory device; and
loading data to be programmed.

8. The method of claim 7, wherein the performing of the program operation further comprises performing a bit line setup operation to provide a ground voltage as a program voltage to bit lines connected to a memory cell to be programmed and a power supply voltage as a program inhibit voltage to bit lines connected to a memory cell to be program inhibited.

9. The method of claim 8, wherein the performing of the program operation further comprises providing a program voltage to a selected word line and a pass voltage to non-selected word lines in order to program the loaded data.

10. The method of claim 9, further comprising performing a core recovery operation to discharge a voltage level of the word lines and the bit lines into a ground voltage after the performing of the program operation.

11. The method of claim 10, further comprising:
deactivating the high voltage generation circuit; and
completing the program operation if program pass occurs as a result of the pass/fail determine operation.

12. The method of 11, further comprising:
increasing a program loop counter value if program fail occurs as a result of the pass/fail determine operation; and
repeating the program operation with an increased program voltage.

13. The method of claim 12, further comprising completing the program operation when the program loop counter value exceeds a reference value.

14. The method of claim 11, further comprising performing a verify recovery operation after the performing of the program verify read operation.

15. The method of claim 1, wherein the bit line setup operation and the pass/fail determine operation are simultaneously performed.

16. A non-volatile memory device comprising:
a memory cell array including memory cells arranged on intersection regions of a plurality of word lines and a plurality of bit lines;
a row decoder receiving an address to select one word line from among the plurality of word lines;
a page buffer temporarily storing data bits to be programmed in the memory cell array or temporarily storing data bits detected from the memory cell array through the bit lines;
a pass/fail check circuit determining whether data values latched in the page buffer are identical to pass data or not during a program verify operation; and
a control logic controlling the row decoder, the page buffer, and the pass/fail check circuit to perform one of a verify recovery operation and a bit line setup operation simultaneously with a pass/fail determine operation, after a verify read operation during a program operation.

17. The memory device of claim 16, wherein the control logic controls the row decoder, the page buffer, and the pass/fail check circuit to simultaneously perform the verify recovery operation and the pass/fail determine operation.

18. The non-volatile memory device of claim 17, wherein a wired-OR scheme is used during the pass/fail determine operation.

19. The non-volatile memory device of claim 18, wherein the pass/fail check circuit comprises:
a precharger precharging a check node to a power supply voltage level in response to a precharge enable signal;
a developer developing data into the check node in response to a developer enable signal, the data being latched in the page buffer; and
a latcher latching a voltage level of the check node in response to a latch enable signal,
wherein the precharge enable signal, the developer enable signal, and the latch enable signal are generated from the control logic during the pass/fail determine operation.

20. The memory device of claim 16, wherein the control logic controls the row decoder, the page buffer, and the pass/fail check circuit to simultaneously perform the bit line setup operation and the pass/fail determine operation.

* * * * *